(12) United States Patent
Herr et al.

(10) Patent No.: US 10,984,336 B2
(45) Date of Patent: Apr. 20, 2021

(54) SUPERCONDUCTING CLOCK CONDITIONING SYSTEM

(71) Applicants: Quentin P. Herr, Ellicott City, MD (US); Jonathan D. Egan, Hanover, MD (US)

(72) Inventors: Quentin P. Herr, Ellicott City, MD (US); Jonathan D. Egan, Hanover, MD (US)

(73) Assignee: NORTHROP GRUMMAN SYSTEMS CORPORATION, Falls Church, VA (US)

( * ) Notice: Subject to any disclaimer, the term of this patent is extended or adjusted under 35 U.S.C. 154(b) by 102 days.

(21) Appl. No.: 16/529,535

(22) Filed: Aug. 1, 2019

(65) Prior Publication Data

US 2021/0035004 A1 Feb. 4, 2021

(51) Int. Cl.
| | |
|---|---|
| H01L 29/06 | (2006.01) |
| G06N 10/00 | (2019.01) |
| H03K 19/195 | (2006.01) |
| H01L 39/22 | (2006.01) |
| G06F 1/06 | (2006.01) |
| H01L 39/24 | (2006.01) |
| G06F 1/12 | (2006.01) |
| H01L 39/02 | (2006.01) |
| G06F 1/10 | (2006.01) |

(52) U.S. Cl.
CPC .............. *G06N 10/00* (2019.01); *G06F 1/06* (2013.01); *G06F 1/10* (2013.01); *G06F 1/12* (2013.01); *H01L 39/025* (2013.01); *H01L 39/22* (2013.01); *H01L 39/2493* (2013.01); *H03K 19/195* (2013.01)

(58) Field of Classification Search
CPC . H01L 39/025; H01L 39/2493; H01L 39/223; G06F 1/10; G06F 1/12; G06F 1/06; G06N 10/00; H03K 19/195
See application file for complete search history.

(56) References Cited

U.S. PATENT DOCUMENTS

| | | | | |
|---|---|---|---|---|
| 6,507,234 | B1 * | 1/2003 | Johnson | ............. H03K 3/38 327/186 |
| 9,467,126 | B1 | 10/2016 | Naaman et al. | |
| 9,473,124 | B1 * | 10/2016 | Mukhanov | ............. H01L 27/18 |
| 10,153,772 | B2 * | 12/2018 | Braun | ............. G11C 19/32 |

(Continued)

OTHER PUBLICATIONS

Naaman, et al.: "Josephson Junction Microwave Modulators for Qubit Control"; dated Feb. 22, 2017; p. 1-18; found on the Internet Aug. 1, 2019 at: https://arxiv.org/pdf/1610.07987.pdf.

(Continued)

*Primary Examiner* — Alonzo Chambliss
(74) *Attorney, Agent, or Firm* — Tarolli, Sundheim, Covell & Tummino LLP

(57) ABSTRACT

One example includes a superconducting clock conditioning system. The system includes a plurality of inductive stages. Each of the plurality of inductive stages includes an inductive signal path that includes at least one inductor and a Josephson junction. The superconducting clock conditioning system is configured to receive an input AC clock signal and to output a conditioned AC clock signal having an approximately square-wave characteristic and having a peak amplitude that is less than a peak amplitude of the input AC clock signal.

20 Claims, 3 Drawing Sheets

(56) References Cited

U.S. PATENT DOCUMENTS

| | | | |
|---|---|---|---|
| 10,389,336 B1 * | 8/2019 | Miller | G06F 1/04 |
| 10,491,178 B2 * | 11/2019 | Naaman | H03F 19/00 |
| 2007/0052441 A1 | 3/2007 | Taguchi et al. | |
| 2009/0319757 A1 | 12/2009 | Berkley | |
| 2020/0287550 A1 * | 9/2020 | Rylov | H03K 19/1952 |

OTHER PUBLICATIONS

International Search Report for Application No. PCT/US2020/041105 dated Nov. 23, 2020.

* cited by examiner

SUPERCONDUCTING CLOCK CONDITIONING SYSTEM

TECHNICAL FIELD

This disclosure relates generally to quantum and classical computing systems, and more specifically to a superconducting clock conditioning system.

BACKGROUND

Superconducting digital technology has provided computing and/or communications resources that benefit from unprecedented high speed, low power dissipation, and low operating temperature. Superconducting digital technology has been developed as an alternative to CMOS technology, and typically comprises superconductor based single flux superconducting circuitry, utilizing superconducting Josephson junctions, and can exhibit typical signal power dissipation of less than 1 nW (nanowatt) per active device at a typical data rate of 20 Gb/s (gigabytes/second) or greater, and can operate at temperatures of around 4 Kelvin.

Multiple Josephson junctions and inductors can be provided in a specific arrangement to provide a Josephson transmission line (JTL) to propagate data signals in superconductor computing systems. Typically, a JTL includes one or more Josephson junctions that are sequentially triggered to propagate a fluxon, such as a Single Flux Quantum (SFQ) pulse, such as in a Rapid Single Flux Quantum (RSFQ) or a Reciprocal Quantum Logic (RQL) encoding scheme. As an example, the sequential triggering can be based on a bias current provided to a given one of the Josephson junctions, such that the Josephson junction can be triggered in response to receiving the fluxon. As a result, the bias current can provided at a time that is approximately concurrent with the arrival of the fluxon to provide appropriate timing for the triggering of the Josephson junction.

SUMMARY

One example includes a superconducting clock conditioning system. The system includes a plurality of inductive stages. Each of the plurality of inductive stages includes an inductive signal path that includes at least one inductor and a Josephson junction. The superconducting clock conditioning system is configured to receive an input AC clock signal and to output a conditioned AC clock signal having an approximately square-wave characteristic and having a peak amplitude that is less than a peak amplitude of the input AC clock signal.

Another example includes a superconducting clock conditioning system. The system includes a plurality of inductive stages arranged as a ladder structure. Each of the plurality of inductive stages includes a first inductor corresponding to a rung of the ladder structure, a second inductor connected to the first inductor and corresponding to a first rail of the ladder structure, and a Josephson junction connected to the first inductor and corresponding to a second rail of the ladder structure. The first and second rails of the ladder structure alternate sides of the ladder structure with respect to consecutive inductive stages of the plurality of inductive stages. The superconducting clock conditioning system is configured to receive an input AC clock signal that propagates through each of the plurality of inductive stages and to output a conditioned AC clock signal.

Another example includes a superconducting circuit. The circuit includes a superconducting transmission line circuit comprising at least one Josephson junction. The circuit can also include a superconducting clock conditioning system which includes a plurality of inductive stages. Each of the plurality of inductive stages includes an inductive signal path that includes at least one inductor and a Josephson junction. The superconducting clock conditioning system is configured to receive an input AC clock signal and to provide a conditioned AC clock signal to the superconducting transmission line circuit to provide a bias to the at least one Josephson junction associated with the superconducting transmission line circuit. The conditioned AC clock signal can have an approximately square-wave characteristic and a peak amplitude that is less than a peak amplitude of the input AC clock signal.

DETAILED DESCRIPTION

This disclosure relates generally to quantum and classical computing systems, and more specifically to a superconducting clock conditioning system. The superconducting clock conditioning system can be configured to provide for a widened clock window which provides a bias to at least one Josephson junction in a Josephson transmission line circuit, as described herein. The superconducting clock conditioning system includes a plurality of inductive stages, each of the plurality of inductive stages comprising an inductive signal path that includes at least one inductor and a Josephson junction. The inductive signal path can include a first inductor and a second inductor, with the first inductor interconnecting the second inductor and the Josephson junction. For example, the superconducting clock conditioning system can be arranged as a ladder structure, such that the first inductor of each of the inductive stages is arranged as a rung of the ladder structure and the second inductor of each of the inductive stages is arranged as a first rail of the ladder structure opposite the Josephson junction arranged as a second rail of the ladder structure.

The superconducting clock conditioning system is configured to convert an input AC clock signal to a conditioned AC clock signal that has an approximate square-wave characteristic and has a peak amplitude that is less than a peak amplitude of the input AC clock signal. As a result, the superconducting clock conditioning system can provide the conditioned AC clock signal to an associated superconducting transmission line circuit to improve a timing window for biasing an associated Josephson junction of the superconducting transmission line circuit. As an example, the inductance values of the inductors and the critical currents of the Josephson junction of each of the inductive stages can be selected to set the peak amplitude and provide a flatness of the square-wave characteristic of the conditioned AC clock signal. As another example, the number of inductive stages of the superconducting clock conditioning system can improve the suppression and flatness of the square-wave characteristic of the conditioned AC clock signal. Therefore, the superconducting clock conditioning system can be designed to increase the phase range of the biasing of the Josephson junction(s) of the superconducting transmission line circuit.

Figure 1:
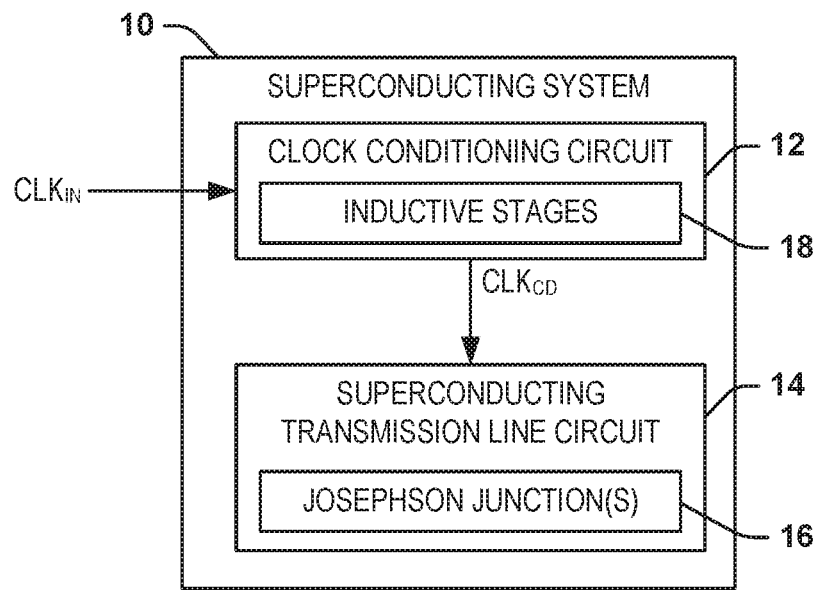
FIG. 1 illustrates an example diagram of a superconducting system.

FIG. 1 illustrates an example diagram of a superconducting system 10. The superconducting system 10 can correspond to any of a variety of superconducting circuits or portions of superconducting circuits, such as in a quantum or combination quantum/classical computer system. The superconducting system 10 includes a superconducting clock conditioning system 12 and a superconducting transmission line circuit 14. As an example, the superconducting transmission line circuit 14 can correspond to any of a variety of superconducting circuits that implements an AC clock signal to provide a bias for at least one Josephson junction 16 associated with the superconducting transmission line circuit 14. For example, the superconducting transmission line circuit 14 can be configured as or can include a Single Flux Quantum (SFQ), a Double Flux Quantum (DFQ), or a Reciprocal Quantum Logic (RQL) circuit.

The superconducting clock conditioning system 12 is demonstrated as including a plurality of inductive stages 18. Each of the inductive stages 18 can include, for example, an inductive signal path that includes at least one inductor and a Josephson junction. As an example, the inductive signal path can include a set of inductors to form a ladder arrangement with the Josephson junction. For example, each of the inductive stages 18 can include a first inductor and a second inductor, with the first inductor interconnecting the second inductor and the Josephson junction. As an example, ladder structure can be structured such that the first inductor of each of the inductive stages 18 is arranged as a rung of the ladder structure and the second inductor of each of the inductive stages 18 is arranged as a first rail of the ladder structure opposite the Josephson junction arranged as a second rail of the ladder structure.

In the example of FIG. 1, the superconducting clock conditioning system 12 receives an AC clock signal $CLK_{IN}$ as an input. For example, the AC clock signal $CLK_{IN}$ can correspond to a sinusoidal signal, and can further correspond to one of an in-phase and quadrature-phase component of a Reciprocal Quantum Logic (RQL) clock signal. As an example, the AC clock signal $CLK_{IN}$ can have an amplitude that is increased relative to a typical AC clock signal that is implemented for superconducting circuits. For example, the AC clock signal $CLK_{IN}$ can have an AC amplitude that is greater than approximately $3*\Phi_0$ (e.g., approximately $3.62*\Phi_0$), and can have a DC amplitude that is greater than approximately $0.25*\Phi_0$ (e.g., approximately $0.5*\Phi_0$). In response to the AC clock signal $CLK_{IN}$ propagating through the inductive stages 18 of the superconducting clock conditioning system 12, the superconducting clock conditioning system 12 can provide a conditioned AC clock signal $CLK_{CD}$ to the superconducting transmission line circuit 14 to bias the Josephson junction(s) 16 at respective phases of the conditioned AC clock signal $CLK_{CD}$, such as at high and low amplitudes of the conditioned AC clock signal $CLK_{CD}$ to respectively trigger and untrigger the Josephson junction(s) 16.

As an example, the conditioned AC clock signal $CLK_{CD}$ can have an approximately square-wave characteristic, and can have a peak amplitude that is less than a peak amplitude of the AC clock signal $CLK_{IN}$. For example, the inductance values of the inductors and the critical currents of the Josephson junction of each of the inductive stages 18 can be selected to set the peak amplitude and provide a flatness of the square-wave characteristic of the conditioned AC clock signal $CLK_{CD}$. As described herein, the term "providing flatness" refers to flattening and broadening the peak amplitude of the AC clock signal $CLK_{IN}$ to transform the AC clock signal $CLK_{IN}$ from having a sinusoidal characteristic to having more of a square-wave characteristic. As a result, the peak amplitude of the conditioned AC clock signal $CLK_{CD}$ can be limited to not exceed the amplitude of a typical AC clock signal. However, the amount of time that the amplitude of the conditioned AC clock signal $CLK_{CD}$ is greater than or equal to a sufficient bias amplitude of the Josephson junction(s) 16 can be greater than an amount of time that the amplitude of a typical AC clock signal is greater than or equal to a sufficient bias amplitude of the Josephson junction(s) 16. Accordingly, the superconducting clock conditioning system 12 can mitigate timing errors associated with providing a sufficient bias to the Josephson junction(s) 16 approximately concurrently with an SFQ pulse to trigger the Josephson junction(s) 16.

Figure 2:
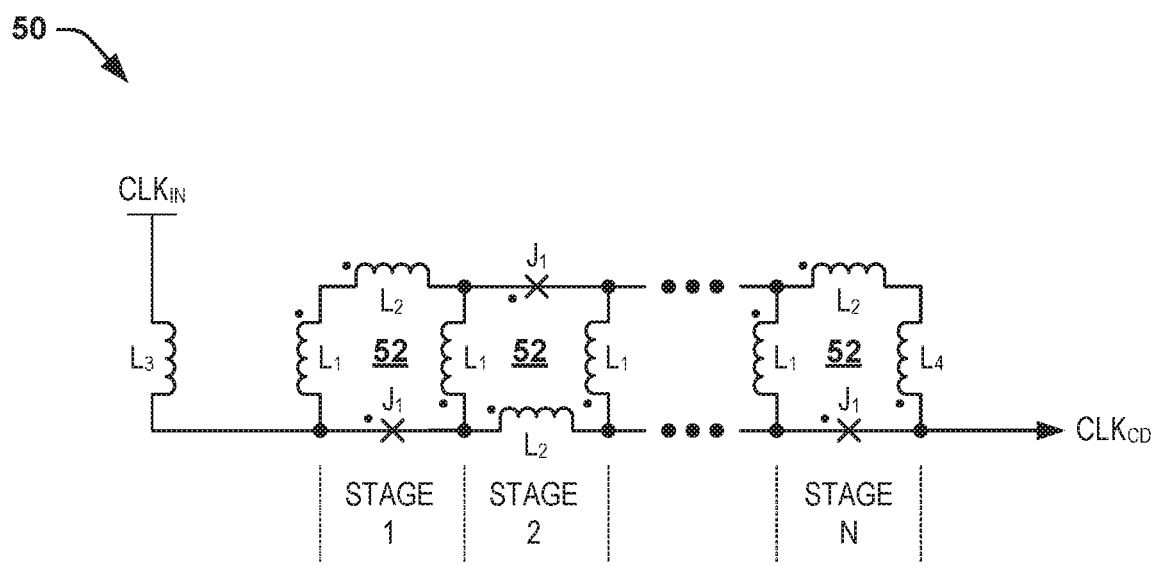
FIG. 2 illustrates an example of a clock conditioning circuit.

FIG. 2 illustrates an example of a clock conditioning circuit 50. The superconducting clock conditioning system 50 can correspond to the superconducting clock conditioning system 12 in the example of FIG. 1. Therefore, reference is to be made to the example of FIG. 1 in the following description of the example of FIG. 2.

The superconducting clock conditioning system 50 is demonstrated as including a plurality N of inductive stages 52, where N is a positive integer. Each of the inductive stages 52 includes a first inductor $L_1$, a second inductor $L_2$, and a Josephson junction $J_1$. As demonstrated in the example of FIG. 2, the superconducting clock conditioning system 50 is demonstrated as a ladder structure, with each of the inductors $L_1$ corresponding to a rung of the ladder structure, and each of the inductors $L_2$ and Josephson junctions $J_1$ corresponding to alternating rails of the ladder structure. In the example of FIG. 2, the input AC clock signal $CLK_{IN}$ is provided to the first inductive stage 52 of the superconducting clock conditioning system 50 via an inductor $L_3$. The AC clock signal $CLK_{IN}$ thus propagates through an inductive signal path that includes the inductors $L_1$ and $L_2$ and the Josephson junction $J_1$ of each of the inductive stages 52, and through a last inductor $L_4$, to provide the conditioned AC clock signal $CLK_{CD}$ from a node that interconnects the Josephson junction $J_1$ of the last inductive stage 52 and the last inductor $L_4$ (e.g., regardless of the number of the inductive stages 52). As an example, the Josephson junctions $J_1$ can have a sufficient critical current to not be triggered by the input AC clock signal $CLK_{IN}$, but can instead act as variable inductors.

As an example, the superconducting clock conditioning system 50 can be designed in a manner that provides the desired characteristics of the conditioned AC clock signal $CLK_{CD}$ from the predetermined characteristics of the input AC clock signal $CLK_{IN}$. As an example, the inductance value of the inductors $L_1$ and $L_2$ can be selected to control (e.g., decrease) an amplitude of the input AC clock signal $CLK_{IN}$. For example, the second inductor $L_2$ can have an inductance value that is approximately twice the inductance value of the first inductor $L_1$ (e.g., the inductance of the first inductor $L_1$ can be approximately 5.4 pH). For example, the Josephson junction $J_1$ of each of the inductive stages 52 can have a critical current of approximately 20 μA. For example, the inductance values of the inductors $L_1$ and $L_2$ and the critical currents of the Josephson junction $J_1$ of each of the inductive stages 52 can be selected to set the peak amplitude and provide a flatness of the square-wave characteristic of the conditioned AC clock signal $CLK_{CD}$. Furthermore, the number of inductive stages 52 can be selected to control the amount of suppression of the input AC clock signal $CLK_{IN}$, and thus to provide the flatness of the conditioned AC clock signal $CLK_{CD}$. Therefore, as an example, the greater the number of the inductive stages 52 and the greater the amplitude of the input AC clock signal $CLK_{IN}$, the wider the square-wave of the conditioned AC clock signal $CLK_{CD}$ will be.

Figure 3:
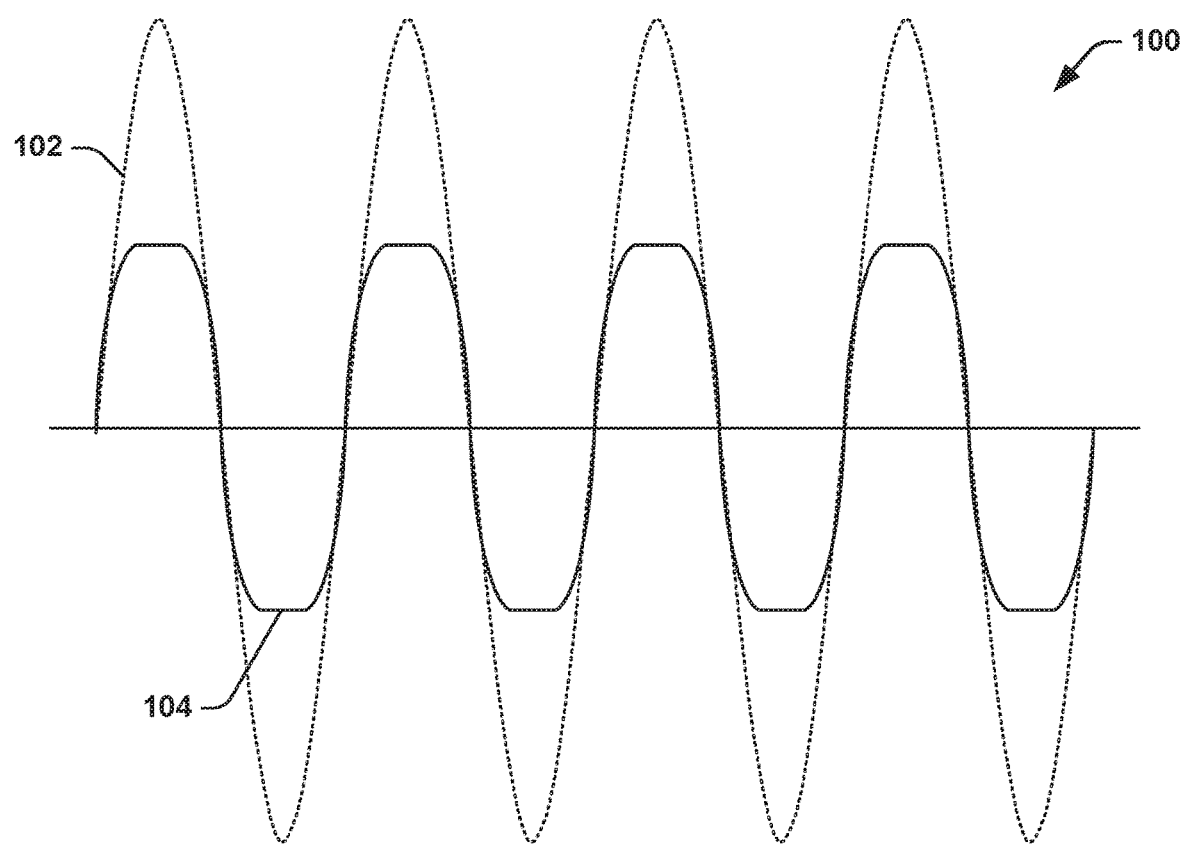
FIG. 3 illustrates an example diagram of clock signals.

FIG. 3 illustrates an example diagram 100 of clock signals. The diagram 100 demonstrates a first clock signal 102 that corresponds to the input AC clock signal $CLK_{IN}$, demonstrated as a dotted line, and a second clock signal 104 that corresponds to the conditioned AC clock signal $CLK_{CD}$, demonstrated as a solid line. The clock signals 102 and 104 are plotted as a function of time. The clock signals 102 and 104 can correspond to the input AC clock signal $CLK_{IN}$ and the conditioned AC clock signal $CLK_{CD}$ in the examples of FIGS. 1 and 2. Therefore, reference is to be made to the examples of FIGS. 1 and 2 in the following description of the example of FIG. 3.

The input AC clock signal $CLK_{IN}$ 102 can be provided as having an AC amplitude that is greater than approximately $3*\Phi_0$ (e.g., approximately $3.62*\Phi_0$), and can have a DC amplitude that is greater than approximately $0.25*\Phi_0$ (e.g., approximately $0.5*\Phi_0$). Therefore, the input AC clock signal $CLK_{IN}$ 102 can have an amplitude that is greater than a typical AC clock signal that is implemented in superconducting circuits. Based on the propagation of the input AC clock signal $CLK_{IN}$ 102 through the inductive stages 52 of the superconducting clock conditioning system 50, the superconducting clock conditioning system 50 can provide suppression of the input AC clock signal $CLK_{IN}$ 102, and thus flatten the input AC clock signal $CLK_{IN}$ 102, to provide the conditioned AC clock signal $CLK_{CD}$ 104. As a result, and as demonstrated in greater detail in the example of FIG. 4, the conditioned AC clock signal $CLK_{CD}$ 104 can be provided as having an approximately square-wave characteristic. As described previously, the square-wave characteristic can be tuned based on the number of inductive stages 52 of the superconducting clock conditioning system 50, as well as the values of the inductors $L_1$ and $L_2$, and the critical current of the Josephson junctions $J_1$. It is to be understood that the conditioned AC clock signal $CLK_{CD}$ is demonstrated simplistically in the example of FIG. 3 and herein, such that the conditioned AC clock signal $CLK_{CD}$ may have different shapes that may still approximate the square-wave characteristic.

Figure 4:
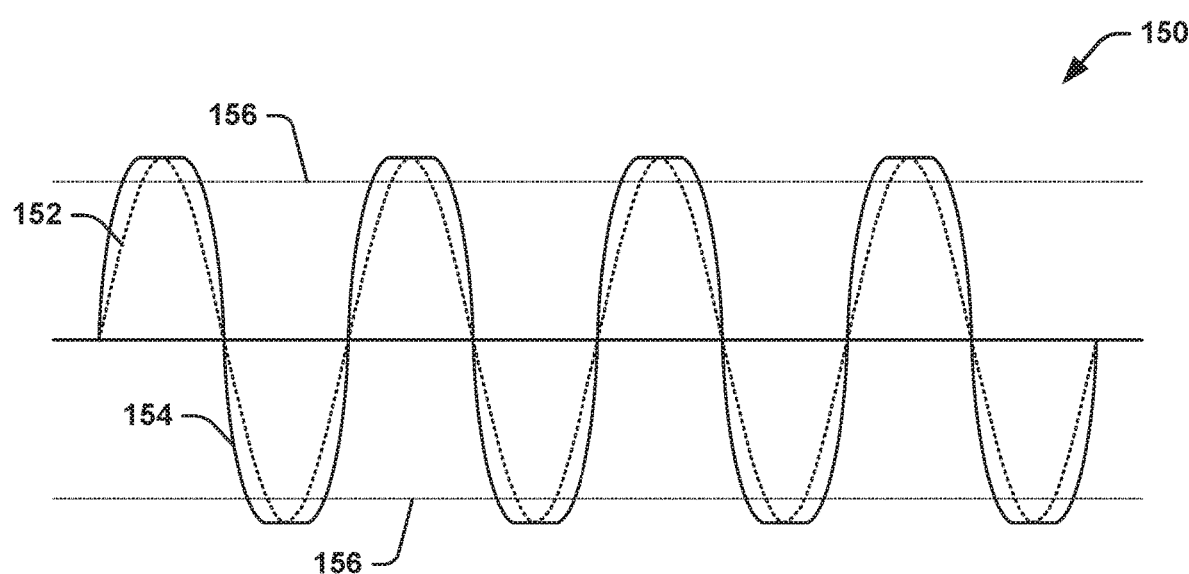
FIG. 4 illustrates another example diagram of clock signals.

FIG. 4 illustrates another example diagram 150 of clock signals. The diagram 150 demonstrates a first clock signal 152 that corresponds to a typical AC clock signal for biasing at least one Josephson junction of a superconducting circuit, demonstrated as a dotted line, and a second clock signal 154 that corresponds to the conditioned AC clock signal $CLK_{CD}$, demonstrated as a solid line. The clock signals 152 and 154 are plotted as a function of time. In the example of FIG. 4, the clock signals 152 and 154 have peak amplitudes that are approximately equal. The diagram 150 also demonstrates threshold values at 156 that correspond to a minimum bias amplitude associated with the Josephson junction(s) 16. Therefore, absolute-value amplitudes of the first and second clock signals 152 and 154 greater than the threshold values 156 are sufficient to bias the Josephson junction(s) 16, such that an SFQ pulse input to the Josephson junction(s) 16 results in triggering of the Josephson junction(s) 16.

Figure 5:
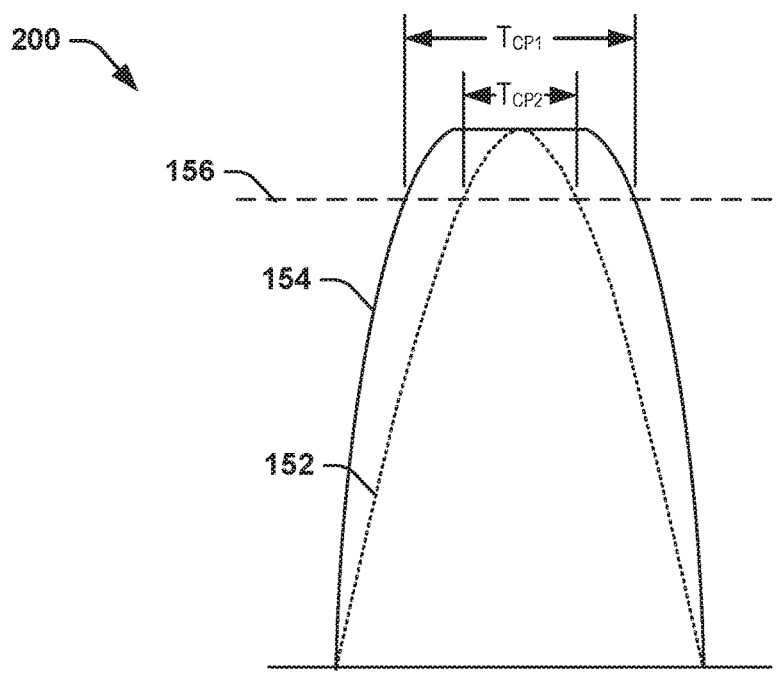
FIG. 5 illustrates an example diagram of timing windows associated with clock signals.

FIG. 5 illustrates an example diagram 200 of timing windows associated with clock signals. The diagram 200 corresponds to an exploded view of one positive phase of the first and second clock signals 152 and 154, which are likewise numbered in the example of FIG. 5 for reference. The diagram 200 also includes the positive threshold value 156, demonstrated as a dashed line. In the example of FIG. 5, the diagram 200 demonstrates a timing window $T_{CP1}$ that corresponds to an amount of time that the conditioned AC clock signal $CLK_{CD}$ 154 has an amplitude that is greater than the threshold 156. Similarly, the diagram 200 demonstrates a timing window $T_{CP2}$ that corresponds to an amount of time that the first clock signal 152 has an amplitude that is greater than the threshold 156.

As demonstrated in the example of FIG. 5, the timing window $T_{CP1}$ is greater than the timing window $T_{CP2}$. The diagram 200 therefore demonstrates the increased timing window of the conditioned AC clock signal $CLK_{CD}$ 154 relative to the first clock signal 152 with respect to biasing the Josephson junction(s) 16 of the superconducting transmission line circuit 14. Therefore, the conditioned AC clock signal $CLK_{CD}$ 154, as generated by the superconducting clock conditioning system 50, can substantially mitigate timing errors associated with biasing the Josephson junction(s) 16 of the superconducting transmission line circuit 14 by increasing a data capture phase, despite having an approximately equal peak amplitude to the typical AC clock signal represented by the first clock signal 152. For example, for a 10 GHz frequency of the typical AC clock signal, the typical AC clock signal can exhibit a phase range of approximately 50.5°, and thus approximately 14 picoseconds. However, as an example, for a superconducting clock conditioning system 50 having five inductive stages 52, with the previously described values of the inductors $L_1$ and $L_2$, the Josephson junctions $J_1$, and the input AC clock signal $CLK_{IN}$, the conditioned AC clock signal $CLK_{CD}$ can exhibit a phase range of approximately 77°, and thus approximately 21 picoseconds, for a conditioned AC clock signal $CLK_{CD}$ having a frequency of approximately 10 GHz. Accordingly, the conditioned AC clock signal $CLK_{CD}$ can significantly increase the timing window $T_{CP2}$ for biasing the Josephson junction(s) 16 relative to a typical AC clock signal.

Figure 6:
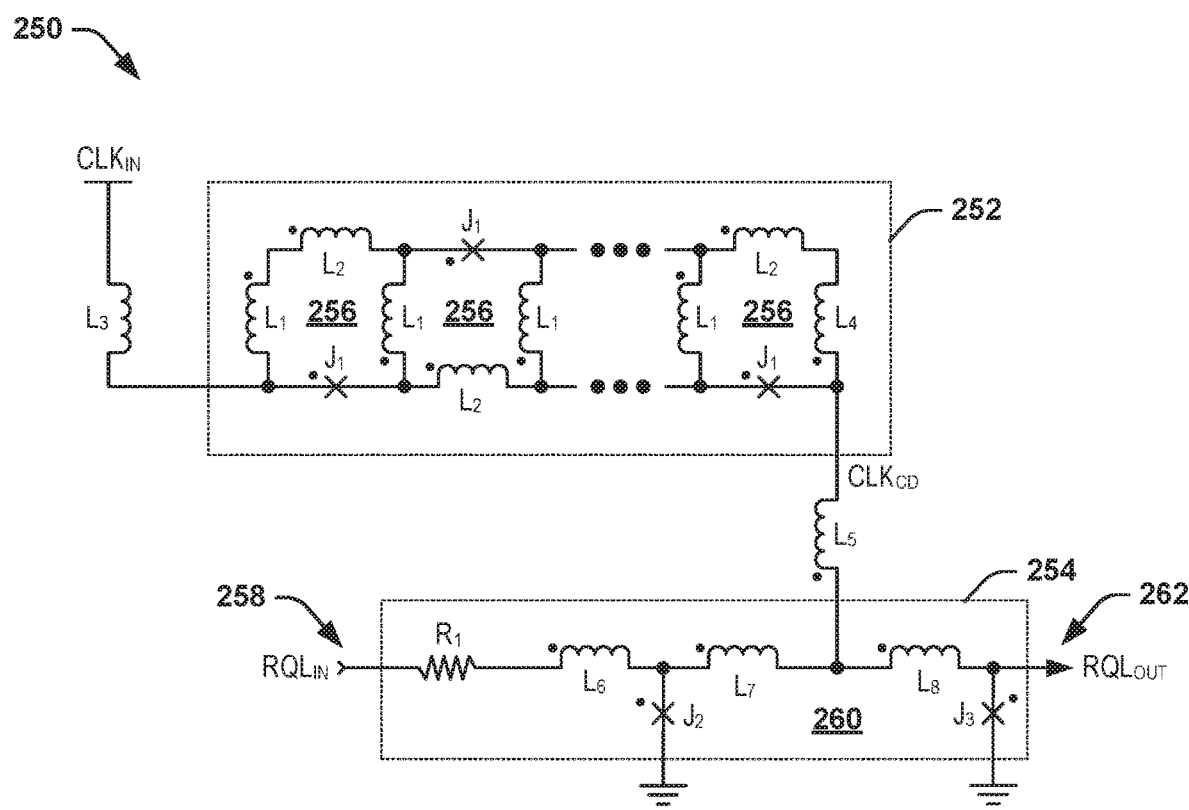
FIG. 6 illustrates an example diagram of a superconducting circuit.

FIG. 6 illustrates an example diagram of a superconducting circuit 250. The superconducting circuit 250 can correspond to the superconducting system 10 in the example of FIG. 1. Therefore, reference is to be made to the examples of FIGS. 1-5 in the following description of the example of FIG. 6.

The superconducting system 10 includes a superconducting clock conditioning system 252 and a superconducting transmission line circuit 254. The superconducting clock conditioning system 252 is demonstrated as being substantially similar to the superconducting clock conditioning system 50 in the example of FIG. 2. In the example of FIG. 6, the superconducting clock conditioning system 252 includes a plurality of inductive stages 256, with each of the inductive stages 256 including a first inductor $L_1$, a second inductor $L_2$, and a Josephson junction $J_1$ arranged as an alternating ladder structure with respect to consecutive stages. In the example of FIG. 6, the input AC clock signal $CLK_{IN}$ is provided to the first inductive stage 256 of the superconducting clock conditioning system 252 via an inductor $L_3$. The AC clock signal $CLK_{IN}$ thus propagates through an inductive signal path that includes the inductors $L_1$ and $L_2$ and the Josephson junction $J_1$ of each of the inductive stages 256, and through a last inductor $L_4$, to provide the conditioned AC clock signal $CLK_{CD}$ from a node that interconnects the Josephson junction $J_1$ of the last inductive stage 256 and the last inductor $L_4$ (e.g., regardless of the number of the inductive stages 256). The conditioned AC clock signal $CLK_{CD}$ is provided to the superconducting transmission line circuit 254 via an inductor $L_5$.

In the example of FIG. 6, the superconducting transmission line circuit 254 is demonstrated as a DFQ PTL receiver. The superconducting transmission line circuit 254 is configured to receive an input RQL pulse (e.g., including a pair of fluxons followed by a pair of anti-fluxons for a DFQ PTL receiver), demonstrated as $RQL_{IN}$, at an input 258. The superconducting transmission line circuit 254 includes a resistor $R_1$ and an inductor $L_6$ through which the input pulse $RQL_{IN}$ propagates. The superconducting transmission line circuit 254 also includes an inductor $L_7$, a Josephson junction $J_2$, an inductor $L_8$, and a Josephson junction $J_3$. The inductors $L_7$ and $L_8$ are each connected to the inductor $L_5$, and thus each receive the conditioned AC clock signal $CLK_{CD}$. The Josephson junctions $J_2$ and $J_3$ can correspond to the Josephson junction(s) 16 in the example of FIG. 1. The inductors $L_7$ and $L_8$ and the Josephson junctions $J_2$ and $J_3$ cooperate to form a Superconducting Quantum Interference Device (SQUID) 260.

As described previously, the input pulse $RQL_{IN}$ can propagate through the resistor $R_1$ and the inductor $L_6$ to the SQUID 260. At approximately this time, the conditioned AC clock signal $CLK_{CD}$ can have an amplitude that is greater than the threshold 156, and can thus be in the timing window $T_{CP1}$. Therefore, the Josephson junctions $J_2$ and $J_3$ can be sufficiently biased by the conditioned AC clock signal $CLK_{CD}$ at the time that the input pulse $RQL_{IN}$ is received. As a result, the Josephson junctions $J_2$ and $J_3$ can trigger based on the combination of the input pulse $RQL_{IN}$ and the amplitude of the conditioned AC clock signal $CLK_{CD}$ exceeding the critical current of the Josephson junctions $J_2$ and $J_3$. Accordingly, the SQUID 260 can provide an output pulse $RQL_{OUT}$ at an output of 262 the superconducting transmission line circuit 254. Therefore, the superconducting clock conditioning system 252 can provide the conditioned AC clock signal $CLK_{CD}$ to mitigate timing errors, such as resulting from fabrication tolerances and/or timing delays in upstream circuits, in capturing the data associated with the input pulse $RQL_{IN}$ to generate the output pulse $RQL_{OUT}$.

It is to be understood that the superconducting circuit 250 is demonstrated in the example of FIG. 6 by example. For example, the superconducting transmission line circuit 254 is not limited to the superconducting receiver demonstrated herein, but can correspond instead to any of a variety of superconducting circuits that are configured to generate or capture SFQ/RQL pulse data. Additionally, the superconducting clock conditioning system 252 can be implemented in each of a plurality of phases of the clock signal in a superconducting system. For example, the superconducting system 250 can include two superconducting clock conditioning systems 252, one for each of an in-phase and a quadrature-phase system that provides data capture at each of four 90° increments of an RQL clock. Accordingly, the superconducting system 250 can be implemented with one or more superconducting clock conditioning systems 252 in a variety of ways.

What have been described above are examples of the disclosure. It is, of course, not possible to describe every conceivable combination of components or method for purposes of describing the disclosure, but one of ordinary skill in the art will recognize that many further combinations and permutations of the disclosure are possible. Accordingly, the disclosure is intended to embrace all such alterations, modifications, and variations that fall within the scope of this application, including the appended claims. Additionally, where the disclosure or claims recite "a," "an," "a first," or "another" element, or the equivalent thereof, it should be interpreted to include one or more than one such element, neither requiring nor excluding two or more such elements. As used herein, the term "includes" means includes but not limited to, and the term "including" means including but not limited to. The term "based on" means based at least in part on.

What is claimed is:

1. A superconducting clock conditioning system comprising a plurality of inductive stages, each of the plurality of inductive stages comprising an inductive signal path that comprises at least one inductor and a Josephson junction, wherein the superconducting clock conditioning system is configured to receive an input AC clock signal and to output a conditioned AC clock signal having an approximately square-wave characteristic and having a peak amplitude that is less than a peak amplitude of the input AC clock signal.

2. The system of claim 1, wherein the inductive signal path comprises a first inductor and a second inductor, wherein the first inductor interconnects the second inductor and the Josephson junction.

3. The system of claim 2, wherein the second inductor of one of the plurality of inductive stages is connected to the first inductor and the Josephson junction of a next one of the plurality of inductive stages.

4. The system of claim 3, wherein the superconducting clock conditioning system is arranged as a ladder structure wherein the first inductor of each of the plurality of inductive stages is arranged as a rung of the ladder structure and the second inductor of each of the plurality of inductive stages is arranged as a first rail of the ladder structure opposite the Josephson junction arranged as a second rail of the ladder structure.

5. The system of claim 4, wherein the first and second rail alternate sides of the ladder structure with respect to consecutive inductive stages of the plurality of inductive stages.

6. The system of claim 2, wherein the second inductor has an inductance value that is twice an inductance value as the first inductor.

7. The system of claim 2, wherein the inductance values of the first and second inductors and the critical current of the Josephson junction of each of the plurality of inductive stages is selected to set the peak amplitude and provide a flatness of the approximately square-wave characteristic of the conditioned AC clock signal.

8. The system of claim 1, wherein the input AC clock signal has an AC amplitude that is greater than approximately $3*\Phi_0$.

9. The system of claim 7, wherein the input AC clock signal has a DC amplitude that is greater than approximately $0.25*\Phi_0$.

10. A superconducting circuit comprising the superconducting clock conditioning system of claim 1, the superconducting circuit further comprising a superconducting transmission line circuit, and wherein the conditioned AC clock signal is provided as an input to the superconducting transmission line circuit to provide a bias to at least one Josephson junction associated with the superconducting transmission line circuit.

11. A superconducting clock conditioning system comprising a plurality of inductive stages arranged as a ladder structure, each of the plurality of inductive stages comprising:

a first inductor corresponding to a rung of the ladder structure;

a second inductor connected to the first inductor and corresponding to a first rail of the ladder structure; and
a Josephson junction connected to the first inductor and corresponding to a second rail of the ladder structure, such that the first and second rails of the ladder structure alternate sides of the ladder structure with respect to consecutive inductive stages of the plurality of inductive stages, wherein the superconducting clock conditioning system is configured to receive an input AC clock signal that propagates through each of the plurality of inductive stages and to output a conditioned AC clock signal.

12. The system of claim 11, wherein the conditioned AC clock signal comprises an approximately square-wave characteristic and has a peak amplitude that is less than a peak amplitude of the input AC clock signal.

13. The system of claim 11, wherein the second inductor of one of the plurality of inductive stages is connected to the first inductor and the Josephson junction of a next one of the plurality of inductive stages.

14. The system of claim 11, wherein the second inductor has an inductance value that is twice an inductance value as the first inductor.

15. The system of claim 11, wherein the inductance values of the first and second inductors and the critical current of the Josephson junction of each of the plurality of inductive stages is selected to set the peak amplitude and provide a flatness of the approximately square-wave characteristic of the conditioned AC clock signal.

16. A superconducting circuit comprising:
a superconducting transmission line circuit comprising at least one Josephson junction; and
a superconducting clock conditioning system comprising a plurality of inductive stages, each of the plurality of inductive stages comprising an inductive signal path that comprises at least one inductor and a Josephson junction, wherein the superconducting clock conditioning system is configured to receive an input AC clock signal and to provide a conditioned AC clock signal to the superconducting transmission line circuit to provide a bias to the at least one Josephson junction associated with the superconducting transmission line circuit, the conditioned AC clock signal having an approximately square-wave characteristic and having a peak amplitude that is less than a peak amplitude of the input AC clock signal.

17. The system of claim 16, wherein the inductive signal path comprises a first inductor and a second inductor, wherein the first inductor interconnects the second inductor and the Josephson junction.

18. The system of claim 17, wherein the second inductor has an inductance value that is twice an inductance value as the first inductor.

19. The system of claim 17, wherein the inductance values of the first and second inductors and the critical current of the Josephson junction of each of the plurality of inductive stages is selected to set the peak amplitude and provide a flatness of the approximately square-wave characteristic of the conditioned AC clock signal.

20. The system of claim 17, wherein the input AC clock signal has an AC amplitude that is greater than approximately $3*\Phi_0$, wherein the input AC clock signal has a DC amplitude that is greater than approximately $0.25*\Phi_0$.

* * * * *